US009203026B2

(12) United States Patent
Tanaka et al.

(10) Patent No.: US 9,203,026 B2
(45) Date of Patent: Dec. 1, 2015

(54) QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventors: Noriaki Tanaka, Chino (JP); Tomohiro Tamura, Suwa (JP); Koji Chindo, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/564,677

(22) Filed: Dec. 9, 2014

(65) Prior Publication Data
US 2015/0171325 A1  Jun. 18, 2015

(30) Foreign Application Priority Data
Dec. 16, 2013  (JP) .................................. 2013-259640

(51) Int. Cl.
*H03L 7/26* (2006.01)
*H01L 49/00* (2006.01)

(52) U.S. Cl.
CPC ................ *H01L 49/006* (2013.01); *H03L 7/26* (2013.01)

(58) Field of Classification Search
CPC ................................ H03L 7/26; H01L 49/006
USPC ...................................................... 331/94.1, 3
See application file for complete search history.

(56) References Cited

U.S. PATENT DOCUMENTS

2002/0163394 A1* 11/2002 Hollberg et al. ............. 331/94.1
2015/0027908 A1*  1/2015 Parsa et al. ....................... 206/7

FOREIGN PATENT DOCUMENTS

JP  2000-068570 A   3/2000
JP  2011-114181 A   6/2011
JP  2012-191523 A   10/2012

* cited by examiner

*Primary Examiner* — Joseph Chang
(74) *Attorney, Agent, or Firm* — Harness, Dickey & Pierce, P.L.C.

(57) ABSTRACT

A quantum interference device includes a wiring board, a second unit including a gas cell in which metal atoms are sealed, a first unit that includes a light emission unit emitting light, which includes a resonance light pair for resonating the metal atoms, toward the metal atoms, and a supporting plate that has a plate shape, supports the first unit and the second unit on one surface side thereof, and is connected to the wiring board on the other surface side thereof. In addition, a second supporting portion supporting the second unit of the supporting plate includes a portion separated from the wiring board.

12 Claims, 12 Drawing Sheets

QUANTUM INTERFERENCE DEVICE, ATOMIC OSCILLATOR, ELECTRONIC APPARATUS, AND MOVING OBJECT

BACKGROUND

1. Technical Field

The present invention relates to a quantum interference device, an atomic oscillator, an electronic apparatus, and a moving object.

2. Related Art

As an oscillator having high-accuracy oscillation characteristics on a long-term basis, an atomic oscillator is known which oscillates on the basis of energy transfer of atoms of an alkali metal such as rubidium or cesium (for example, see JP-A-2012-191523). In general, an operating principle of the atomic oscillator is classified broadly into a method using a double resonance phenomenon based on light and microwaves and a method using a quantum interference effect (CPT: coherent population trapping) based on two types of light beams having different wavelengths. However, the atomic oscillator using a quantum interference effect can be made smaller than the atomic oscillator using a double resonance phenomenon, and thus has been recently expected to be mounted to various devices.

For example, as disclosed in JP-A-2012-191523, the atomic oscillator using a quantum interference effect includes a gas cell in which gaseous metal atoms are sealed, a light emission unit that irradiates the metal atoms in the gas cell with a laser beam including two types of resonance light beams having different frequencies, a light detection unit that detects the laser beam having passed through the gas cell, and an optical component provided between the light emission unit and the gas cell. In such an atomic oscillator, an electromagnetically induced transparency (EIT) phenomenon occurs in which both of the two types of resonance light beams pass without being absorbed into the metal atoms within the gas cell when a frequency difference between the two types of resonance light beams has a specific value. The photodetector detects an EIT signal which is a sharp signal generated in association with the EIT phenomenon.

In the atomic oscillator disclosed in JP-A-2012-191523, the gas cell and the light detection unit are accommodated in a first package, the light emission unit is accommodated in a second package, and the optical component is accommodated in a third package. The packages are bonded to each other in the order of the first package, the third package, and the second package. The packages are mounted on, for example, a substrate and used in a state where the packages are bonded to each other.

However, in such an atomic oscillator, when the substrate is deformed due to an external force applied thereto, the external force is transmitted to the packages through the substrate. As a result, there is a possibility of a positional deviation of each package, that is, an optical axis deviation of the atomic oscillator occurring. Further, there is a possibility of the temperature of the substrate being changed due to, for example, a change in an environmental temperature or exhaust heat of the light emission unit. In this case, there is a concern that the temperature change may affect the packages on the substrate.

SUMMARY

An advantage of some aspects of the invention is to provide a quantum interference device, an atomic oscillator, an electronic apparatus, and a moving object which are capable of reducing an optical axis deviation caused by, for example, the distortion of a substrate and reducing influence due to heat from the outside.

The invention can be implemented as the following forms or application examples.

Application Example 1

This application example is directed to a quantum interference device including a substrate; a gas cell unit that includes a gas cell in which metal atoms are sealed; a power supply unit that includes a power supply emitting light, which includes a resonance light pair for resonating the metal atoms, and a connection member that is connected to the gas cell unit and the power supply unit on one surface side and is connected to the substrate on the other surface side. A portion of the connection member which is connected to the gas cell unit has a portion which is separated from the substrate.

In the quantum interference device according to the application example, the gas cell unit and the substrate are separated from each other, and thus it is possible to reduce influence due to heat from the substrate of the gas cell unit. Further, the gas cell unit and the light emission unit are connected to each other on the same surface of the connection member, and thus it is possible to reduce optical axis deviations of the gas cell unit and the light emission unit due to, for example, the distortion of the substrate.

Application Example 2

In the quantum interference device according to the application example, it is preferable that a gap is provided between the gas cell unit and the substrate.

With this configuration, it is possible to reduce influence due to heat from the substrate of the gas cell unit.

Application Example 3

In the quantum interference device according to the application example, it is preferable that an area of a region where the connection member and the gas cell unit overlap each other in a plan view of the connection member is equal to or less than 50% of an area of the gas cell unit in a plan view of the connection member.

With this configuration, it is possible to sufficiently reduce the contact area between the gas cell unit and the connection member. Therefore, it is possible to effectively reduce heat transmission from the substrate to the gas cell unit through the connection member.

Application Example 4

In the quantum interference device according to the application example, it is preferable that the connection member and the gas cell unit come into contact with each other through a plurality of surfaces.

With this configuration, as the connection member and the gas cell unit come into contact with each other through a plurality of surfaces, heat is further distributed, as compared with a case where the connection member and the gas cell unit come into contact with each other through one surface. As a result, it is possible to more effectively reduce heat transmission from the substrate to the gas cell unit through the connection member.

Application Example 5

In the quantum interference device according to the application example, it is preferable that one end side of the connection member is supported by the substrate and the other end side thereof is connected to the gas cell unit.

With this configuration, it is possible to prominently exhibit the effects of the invention.

Application Example 6

In the quantum interference device according to the application example, it is preferable that a regulation member is provided between the substrate and the portion of the connection member which is connected to the gas cell unit so as to regulate a separation distance therebetween.

With this configuration, it is possible to prevent the deformation of the connection member and the displacement of a portion supporting the gas cell unit. That is, it is possible to increase the strength of the connection member.

Application Example 7

In the quantum interference device according to the application example, it is preferable that a heat insulator is provided between the connection member and the gas cell unit.

With this configuration, it is possible to effectively reduce heat transmission from the connection member to the gas cell unit.

Application Example 8

In the quantum interference device according to the application example, it is preferable that a portion of the connection member which is connected to at least the power supply unit includes a metal material.

With this configuration, it is possible to effectively radiate heat generated from the power supply unit to the outside through a metal material having a relatively high thermal conductivity.

Application Example 9

In the quantum interference device according to the application example, it is preferable that the connection member includes a positioning portion that performs positioning in an emission direction of the light.

With this configuration, it is possible to easily perform the positioning of the gas cell unit and the power supply unit.

Application Example 10

This application example is directed to an atomic oscillator including the quantum interference device according to the application example.

With this configuration, it is possible to provide the atomic oscillator having excellent reliability.

Application Example 11

This application example is directed to an electronic apparatus including the quantum interference device according to the application example.

With this configuration, it is possible to provide the electronic apparatus having excellent reliability.

Application Example 12

This application example is directed to a moving object including the quantum interference device according to the application example.

With this configuration, it is possible to provide the moving object having excellent reliability.

BRIEF DESCRIPTION OF THE DRAWINGS

The invention will be described with reference to the accompanying drawings, wherein like numbers reference like elements.

FIG. 7A is a perspective view and FIG. 7B is a plan view.

FIG. 8A is a plan view and FIG. 8B is a cross-sectional view taken along line B-B in FIG. 8A.

DESCRIPTION OF EXEMPLARY EMBODIMENTS

Hereinafter, a quantum interference device and an atomic oscillator according to the invention will be described in detail with reference to an embodiment shown in the accompanying drawings.

1. Atomic Oscillator (Quantum Interference Device)

First, the atomic oscillator according to the invention (atomic oscillator including the quantum interference device according to the invention) will be described. Meanwhile, a description of an example in which the quantum interference device according to the invention is applied to the atomic oscillator will be made below. However, the quantum interference device according to the invention is not limited thereto, and can be applied to, for example, a magnetic sensor, a quantum memory, and the like, in addition to the atomic oscillator.

First Embodiment

Figure 1:
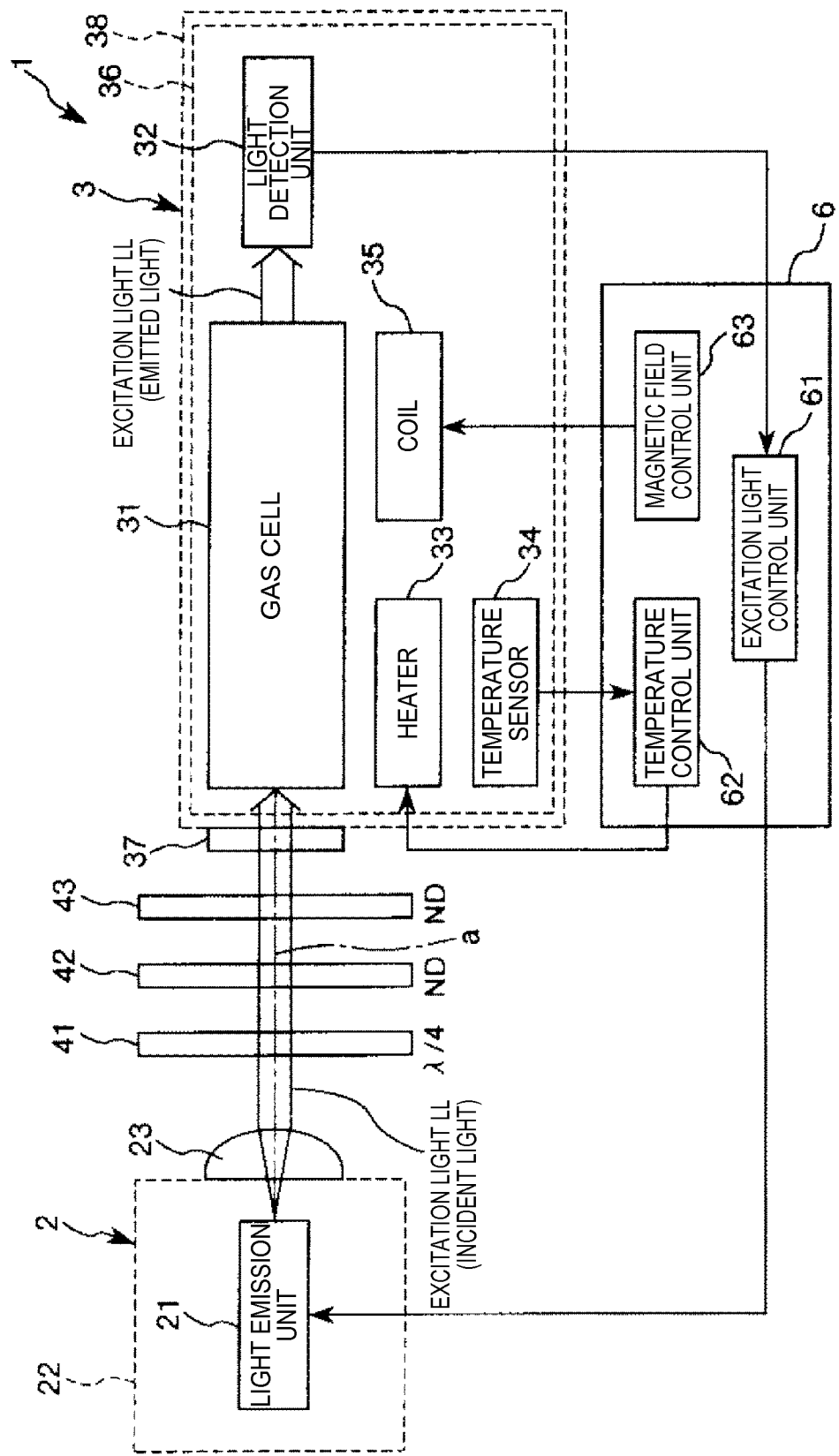
FIG. 1 is a diagram showing a schematic configuration of an atomic oscillator (quantum interference device) according to a first embodiment of the invention.
Figure 2:
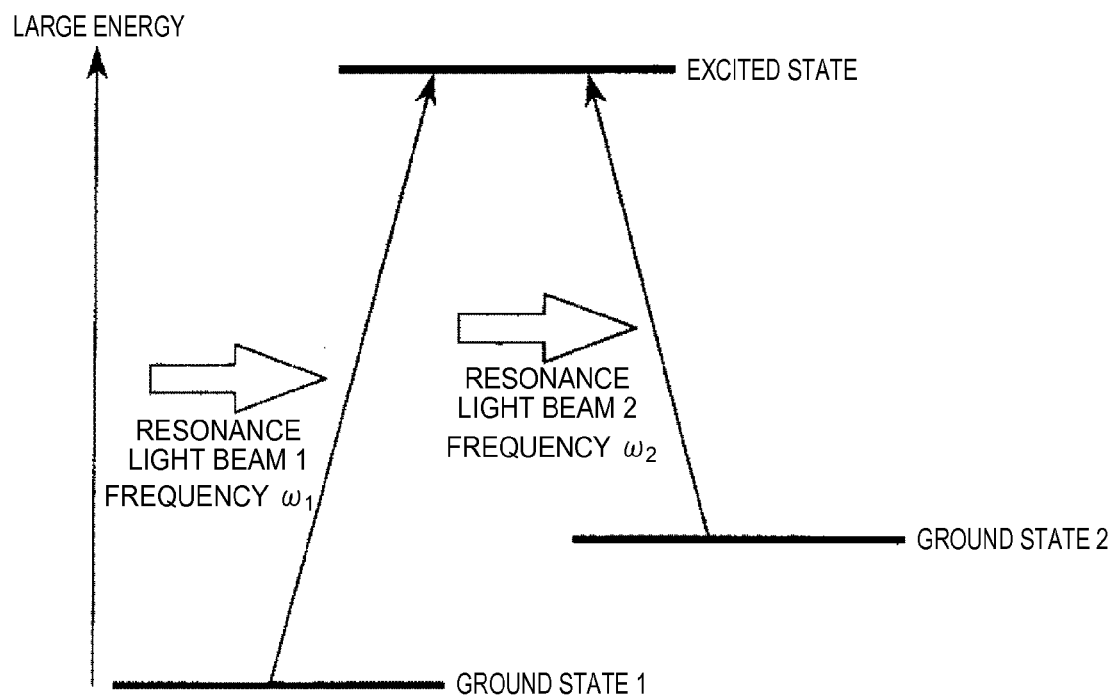
FIG. 2 is a diagram illustrating an energy state of an alkali metal.
Figure 3:
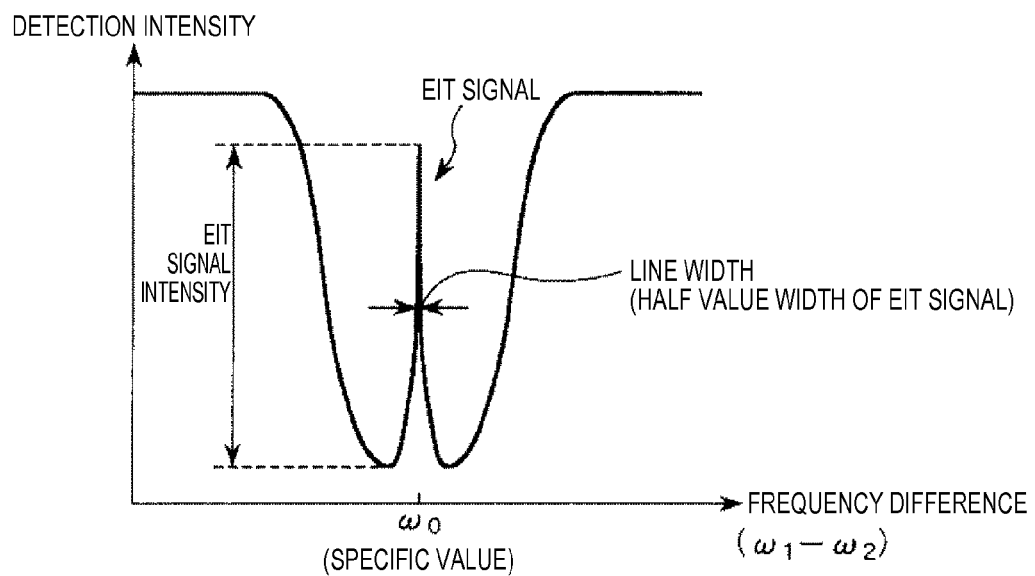
FIG. 3 is a graph showing a relationship between intensity of light detected by a light detection unit and a frequency difference between two light beams emitted from a light emission unit.
Figure 4:
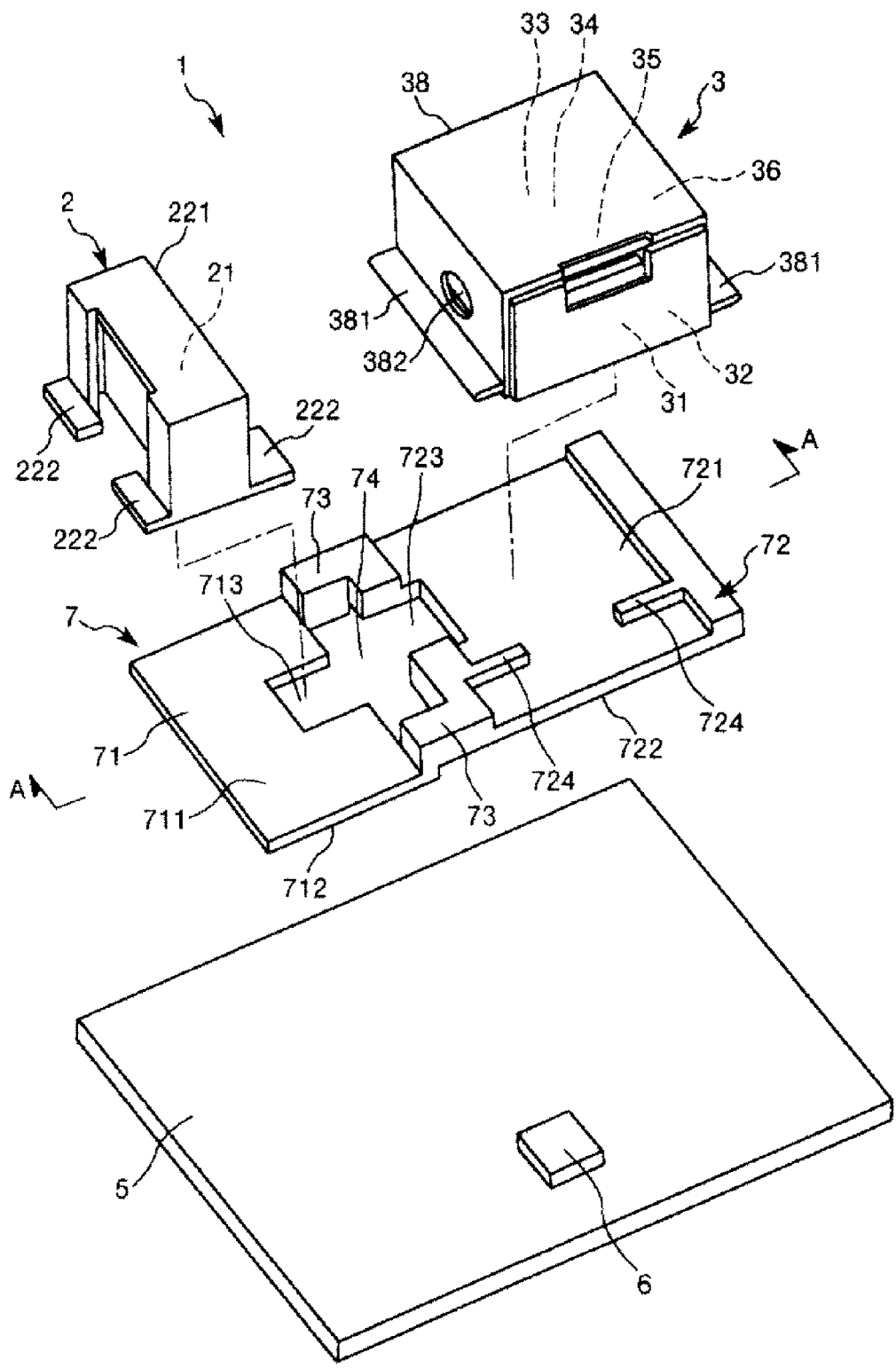
FIG. 4 is an exploded perspective view of the atomic oscillator (quantum interference device) shown in FIG. 1.

FIG. 1 is a diagram showing a schematic configuration of an atomic oscillator (quantum interference device) according to a first embodiment of the invention. In addition, FIG. 2 is a diagram illustrating an energy state of an alkali metal, FIG. 3 is a graph showing a relationship between intensity of light detected by a light detection unit and a frequency difference between two light beams emitted from the light emission unit, and FIG. 4 is an exploded perspective view of the atomic oscillator shown in FIG. 1.

An atomic oscillator 1 shown in FIG. 1 is an atomic oscillator using a quantum interference effect.

As shown in FIG. 1, the atomic oscillator 1 includes a first unit (power supply unit) 2 which is a unit on the light emission side, a second unit (gas cell unit) 3 which is a unit on the light detection side, a supporting plate (connection member) 7 that supports the units 2 and 3, optical components 41, 42, and 43 that are provided between the units 2 and 3, a control unit 6 that controls the first unit 2 and the second unit 3, and a wiring board 5 that supports these components.

Here, the first unit 2 includes a light emission unit (power supply) 21 and a first package 22 that accommodates the light emission unit 21.

In addition, the second unit 3 includes a gas cell 31, a light detection unit 32, a heater 33, a temperature sensor 34, a coil 35, a second package 36 that accommodates these components, and a magnetic shield 38 that accommodates the second package 36.

First, the principle of the atomic oscillator 1 will be briefly described.

As shown in FIG. 1, in the atomic oscillator 1, the light emission unit 21 emits an excitation light LL toward the gas cell 31, and the excitation light LL passing through the gas cell 31 is detected by the light detection unit 32.

A gaseous alkali metal (metal atom) is sealed in the gas cell 31. As shown in FIG. 2, the alkali metal has an energy level of a three-level system, and can take three states of two ground states (ground states 1 and 2) having different energy levels and an excited state. Here, the ground state 1 is an energy state which is lower than the ground state 2.

The excitation light LL emitted from the light emission unit 21 includes two types of resonance light beams 1 and 2 having different frequencies. When the above-described gaseous alkali metal is irradiated with the two types of resonance light beams 1 and 2, the light absorptivity (light transmittance) of the resonance light beams 1 and 2 in the alkali metal changes in accordance with a difference ($\omega 1-\omega 2$) between a frequency $\omega 1$ of the resonance light beam 1 and a frequency $\omega 2$ of the resonance light beam 2.

When the difference ($\omega 1-\omega 2$) between the frequency $\omega 1$ of the resonance light beam 1 and the frequency $\omega 2$ of the resonance light beam 2 is coincident with a frequency equivalent to an energy difference between the ground state 1 and the ground state 2, excitation to the excited state from each of the ground states 1 and 2 is stopped. At this time, both the resonance light beams 1 and 2 pass without being absorbed into the alkali metal. Such a phenomenon is referred to as a CPT phenomenon or an electromagnetically induced transparency (EIT) phenomenon.

For example, in a case where the light emission unit 21 fixes the frequency $\omega 1$ of the resonance light beam 1 and changes the frequency $\omega 2$ of the resonance light beam 2, when the difference ($\omega 1-\omega 2$) between the frequency $\omega 1$ of the resonance light beam 1 and the frequency $\omega 2$ of the resonance light beam 2 is coincident with a frequency $\omega 0$ equivalent to an energy difference between the ground state 1 and the ground state 2, the detection intensity of the light detection unit 32 sharply increases as shown in FIG. 3. Such a sharp signal is detected as an EIT signal. The EIT signal has an eigenvalue which is determined in accordance with the type of an alkali metal. Therefore, it is possible to configure an oscillator by using such an EIT signal.

Hereinafter, a specific configuration of the atomic oscillator 1 of this embodiment will be described.

Figure 5:
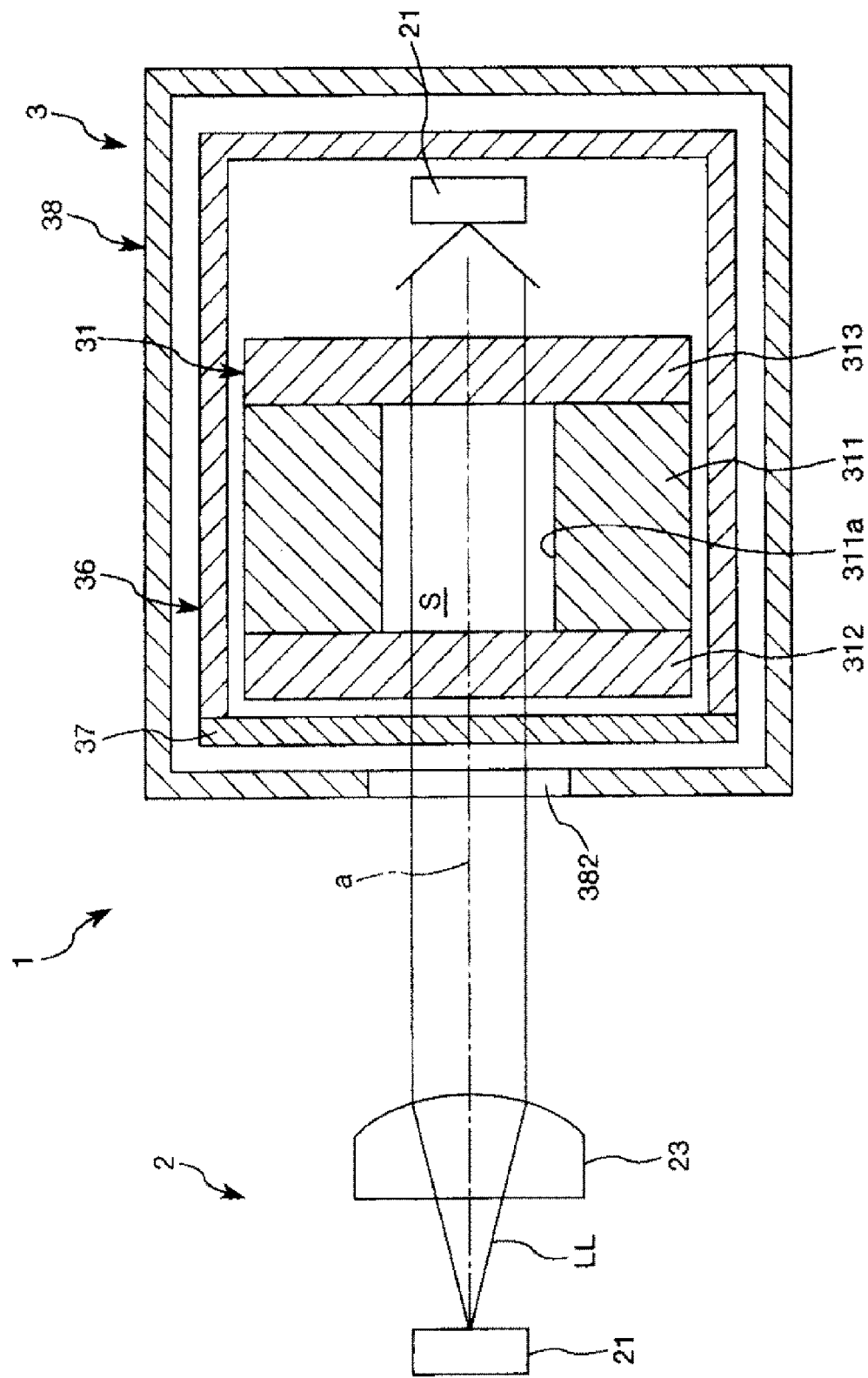
FIG. 5 is a schematic diagram illustrating the light emission unit and a gas cell unit which are included in the atomic oscillator shown in FIG. 1.
Figure 6:
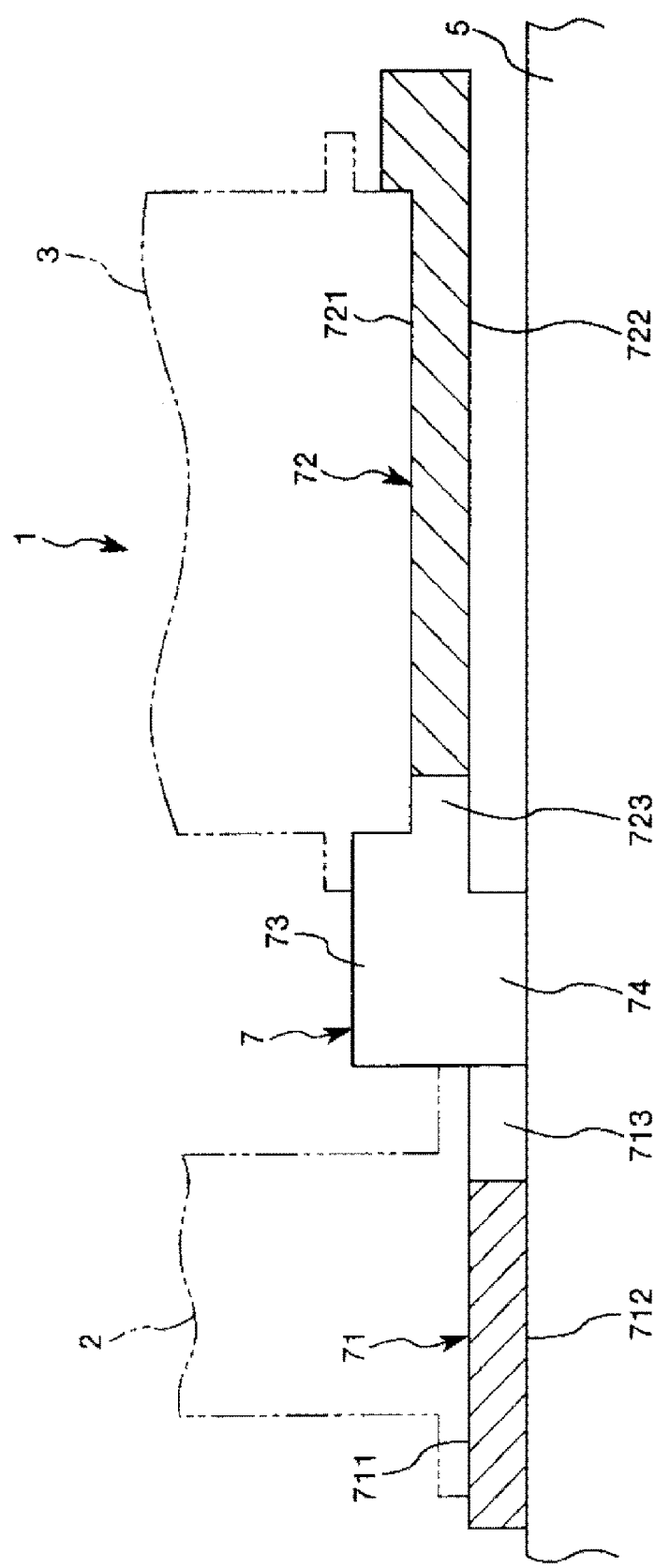
FIG. 6 is a cross-sectional view taken along line A-A in FIG. 4.

FIG. 4 is an exploded perspective view of the atomic oscillator shown in FIG. 1, FIG. 5 is a schematic diagram illustrating the light emission unit and the gas cell unit which are included in the atomic oscillator shown in FIG. 1, and FIG. 6 is a cross-sectional view taken along line A-A in FIG. 4. Meanwhile, hereinafter, an upper side in FIGS. 4 to 6 will be referred to as "up", and a lower side in FIG. 5 will be referred to as "down".

As shown in FIG. 4, the control unit 6 is mounted on the atomic oscillator 1. The atomic oscillator includes the wiring board 5 which holds the first unit 2, the second unit 3, and the optical components 41, 42, and 43, and a supporting plate 7 that supports (connects) the first unit 2 and the second unit 3 on the same face side.

The first unit 2 and the second unit 3 are electrically connected to the control unit 6 through a wiring and a connector (not shown) of the wiring board 5, and the driving thereof is controlled by the control unit 6.

Hereinafter, the units of the atomic oscillator 1 will be sequentially described in detail.

First Unit

As mentioned above, the first unit 2 includes the light emission unit 21 and the first package 22 accommodating the light emission unit 21.

Light Emission Unit

The light emission unit 21 has a function of emitting the excitation light LL for exciting the alkali metal atoms in the gas cell 31.

More specifically, the light emission unit 21 is used to emit light, which includes the above-described two types of light beams (the resonance light beam 1 and the resonance light beam 2) having different frequencies, as the excitation light LL.

The frequency 1 of the resonance light beam 1 is capable of exciting (resonating) the alkali metal in the gas cell 31 to an excited state from the above-described ground state 1.

In addition, the frequency $\omega 2$ of the resonance light beam 2 is capable of exciting (resonating) the alkali metal in the gas cell 31 to an excited state from the above-described ground state 2.

The light emission unit 21 is not particularly limited as long as the unit is a unit capable of emitting the above-described excitation light LL, but a semiconductor laser such as a vertical cavity surface emitting laser (VCSEL) can be used as the unit.

In addition, the temperature of such a light emission unit 21 is adjusted to a predetermined temperature using a temperature adjusting element (a heating resistor, a Peltier element, or the like) not shown in the drawing.

First Package

The first package 22 accommodates the light emission unit 21 mentioned above.

As shown in FIG. 4, the first package 22 includes a first package main body 221 which is constituted by a housing having an external shape being a block shape, and a plurality of (four in this embodiment) leg portions 222 which have a plate shape and are provided at a lower end of the first package main body 221. The leg portions 222 are portions abutting on the supporting plate 7 when the first unit 2 is mounted to the supporting plate 7. The leg portions 222 are provided at corner portions of the first package main body 221. Thus, it is possible to stably mount the first unit 2 to the supporting plate 7.

In addition, for example, a plurality of leads (not shown) protrude from the first package main body 221 and are electrically connected to the light emission unit 21 through wirings. The leads are electrically connected to the wiring board 5 using a connector not shown in the drawing, or the like. For example, a flexible substrate or a connector having a socket shape can be used as the connector.

In addition, a wall portion of the first package main body 221 on the second unit 3 side is provided with a window portion 23. The window portion 23 is provided on an optical axis (axis a of the excitation light LL) between the gas cell 31 and the light emission unit 21. The window portion 23 has light transmittance with respect to the excitation light LL mentioned above.

In this embodiment, the window portion 23 is a lens. Thus, it is possible to irradiate the gas cell 31 with the excitation light LL without any waste. In addition, the window portion 23 has a function of converting the excitation light LL into parallel light. That is, the window portion 23 is a collimate lens, and the excitation light LL in an internal space S is parallel light. Thus, it is possible to increase the number of alkali metal atoms resonating by the excitation light LL emitted from the light emission unit 21 among alkali metal atoms which are present in the internal space S. As a result, it is possible to increase the intensity of an EIT signal.

Meanwhile, the window portion 23 is not limited to a lens as long as it is a portion having light transmittance with respect to the excitation light LL. For example, the window portion may be an optical component other than a lens, or may be a simple light transmissive plate-shaped member. In this case, a lens having the above-described function may be provided between the first package 22 and the second package 36 similar to, for example, the optical components 41, 42, and 43 to be described later.

A constituent material of a portion of the first package 22 other than the window portion 23 is not particularly limited. For example, ceramics, a metal, or a resin can be used as the constituent material.

Here, when a portion of the first package 22 other than the window portion 23 is formed of a material having light transmittance with respect to excitation light, it is possible to integrally form the window portion 23 and the portion of the first package 22 other than the window portion 23. In addition, when the portion of the first package 22 other than the window portion 23 is formed of a material that does not have light transmittance with respect to excitation light, the window portion 23 and the portion of the first package 22 other than the window portion 23 may be formed as separate bodies and may be bonded to each other using a well-known bonding method.

In addition, it is preferable that the inside of the first package 22 is an airtight space. Thus, it is possible to set the inside of the first package 22 to be in a decompression state or a state where an inert gas is sealed. As a result, it is possible to improve the characteristics of the atomic oscillator 1.

In addition, a temperature adjusting element or a temperature sensor which adjusts the temperature of the light emission unit 21 may be accommodated in the first package 22 (not shown). Examples of the temperature adjusting element include a heating resistor (heater), a Peltier element, and the like.

According to the first package 22, it is possible to accommodate the light emission unit 21 in the first package 22 while allowing the emission of excitation light to the outside of the first package 22 from the light emission unit 21.

Second Unit

As mentioned above, the second unit 3 includes the gas cell 31, the light detection unit 32, the heater 33, the temperature sensor 34, the coil 35, the second package 36 that accommodates these components, and a magnetic shield 38 that accommodates the second package 36.

Gas Cell

An alkali metal such as gaseous rubidium, cesium, or sodium is sealed in the gas cell 31. In addition, a rare gas such as argon or neon and an inert gas such as nitrogen may be sealed as a buffer gas in the gas cell 31 together with an alkali metal gas, when necessary.

For example, as shown in FIG. 5, the gas cell 31 includes a main body 311 having a columnar through hole 311a, and a pair of window portions 312 and 313 that close both openings of the through hole 311a. Thus, the above-described internal space S having an alkali metal sealed therein is formed.

A material constituting the main body 311 is not particularly limited, but includes a metal material, a resin material, a glass material, a silicon material, quartz crystal, and the like. From the viewpoint of processability and bonding between the window portions 312 and 313, a glass material and a silicon material are preferably used.

The window portions 312 and 313 are airtightly bonded to such a main body 311. Thus, it is possible to make the internal space S of the gas cell 31 into an airtight space.

A method of bonding the main body 311 and the window portions 312 and 313 is determined in accordance with the constituent materials thereof, and is not particularly limited. For example, a bonding method using an adhesive, a direct bonding method, and an anodic bonding method can be used as the method.

In addition, a material constituting the window portions 312 and 313 is not particularly limited as long as the material has light transmittance with respect to the excitation light LL mentioned above. Examples of the material include a silicon material, a glass material, quartz crystal, and the like.

The window portions 312 and 313 have light transmittance with respect to the excitation light LL from the light emission unit 21 mentioned above. One window portion 312 transmits the excitation light LL which enters the gas cell 31, and the other window portion 313 transmits the excitation light LL emitted from the gas cell 31.

In addition, the gas cell 31 is heated by the heater 33, and the temperature thereof is adjusted to a predetermined temperature.

Light Detection Unit

The light detection unit 32 has a function of detecting the intensity of the excitation light LL (resonance light beams 1 and 2) passing through the gas cell 31.

The light detection unit 32 is not particularly limited as long as the unit is a unit capable of detecting the above-described excitation light. For example, a photodetector (light-receiving element) such as a solar cell or a photodiode can be used.

Heater

The heater 33 has a function of heating the above-described gas cell 31 (more specifically, an alkali metal in the gas cell 31). Thus, it is possible to maintain the alkali metal in the gas cell 31 to a gaseous state having a desired concentration.

The heater 33 is heated by electrical conduction. For example, the heater is constituted by a heating resistor provided on the outer surface of the gas cell 31. Such a heating resistor is formed using, for example, a chemical vapor deposition (CVD) such as a plasma CVD or a thermal CVD, a dry plating method such as vacuum deposition, or a sol-gel method.

Here, when the heating resistor is provided in an incidence unit or an emission unit of the excitation light LL of the gas cell 31, the heating resistor is constituted by a material having light transmittance with respect to the excitation light, specifically, a transparent electrode material such as an oxide, for example, indium tin oxide (ITO), indium zinc oxide (IZO), $In_3O_3$, $SnO_2$, $SnO_2$ containing Sb, or ZnO containing Al.

Meanwhile, the heater 33 is not particularly limited as long as the heater is a heater capable of heating the gas cell 31, and may not come into contact with the gas cell 31. In addition, the gas cell 31 may be heated using a Peltier element or a ceramic heater instead of the heater 33 or in conjunction with the heater 33.

Such a heater 33 is electrically connected to the temperature control unit 62 of the control unit 6 to be described later, and thus the electrical conduction thereof is controlled.

Temperature Sensor

The temperature sensor 34 is used to detect the temperature of the heater 33 or the gas cell 31.

The amount of heat generated by the heater 33 mentioned above is controlled on the basis of detection results of the temperature sensor 34. Thus, it is possible to maintain the alkali metal atoms within the gas cell 31 to a desired temperature.

Meanwhile, an installation position of the temperature sensor 34 is not particularly limited. For example, the temperature sensor may be installed on the heater 33 or may be installed on the outer surface of the gas cell 31.

The temperature sensor 34 is not particularly limited, and various types of temperature sensors such as a thermistor or a thermocouple can be used as the temperature sensor.

Such a temperature sensor 34 is electrically connected to the temperature control unit 62 of the control unit 6 to be described later through a wiring not shown in the drawing.

Coil

The coil 35 has a function of generating a magnetic field in a direction along (parallel to) the axis a of the excitation light LL in the internal space S by electrical conduction. Thus, it is possible to improve resolution by widening a gap between different energy levels at which the atoms of the alkali metal within the internal space S degenerate by Zeeman splitting, and to reduce a line width of an EIT signal.

Meanwhile, the magnetic field generated by the coil 35 may be any of a DC magnetic field and an AC magnetic field, or may be a magnetic field in which a DC magnetic field and an AC magnetic field are superimposed on each other.

The installation position of the coil 35 is not particularly limited. Although not shown in the drawing, for example, the coil may be wound around the outer circumference of the gas cell 31 so as to configure a solenoid type, or a pair of coils may face each other through the gas cell 31 so as to configure a Helmholtz type.

The coil 35 is electrically connected to a magnetic field control unit 63 of the control unit 6 to be described later through a wiring not shown in the drawing. Thus, it is possible to electrify the coil 35.

Second Package

The second package 36 is constituted by a housing having an external shape being a block shape, and accommodates the gas cell 31, the light detection unit 32, the heater 33, the temperature sensor 34, and the coil 35 which are described above.

In addition, the second package 36 directly or indirectly supports the gas cell 31, the light detection unit 32, the heater 33, the temperature sensor 34, and the coil 35 therein.

In addition, a wall portion of the second package 36 on the first unit 2 side is provided with a window portion 37. The window portion 37 is provided on an optical axis (axis a) between the gas cell 31 and the light emission unit 21. The window portion 37 has light transmittance with respect to the excitation light mentioned above.

Meanwhile, the window portion 37 is not limited to having light transmittance as long as the portion has light transmittance with respect to excitation light, and may be an optical component such as a lens, a polarizing plate, or a λ/4 wavelength plate.

A constituent material of a portion of the second package 36 other than the window portion 37 is not particularly limited. For example, ceramics, a metal, or a resin can be used as the constituent material.

Magnetic Shield

The magnetic shield 38 is constituted by a housing having an external shape being a block shape and accommodates the second package 36 therein. The magnetic shield 38 has a magnetic shielding property and has a function of shielding the alkali metal within the gas cell 31 from an external magnetic field. Thus, it is possible to achieve an improvement in the stability of a magnetic field of the coil 35 within the magnetic shield 38. Accordingly, it is possible to achieve an improvement in the oscillation characteristics of the atomic oscillator 1.

In addition, a wall portion of the magnetic shield 38 on the first unit 2 side is provided with a window portion 382. Thus, light emitted from the light emission unit 21 can be incident on the window portion 37 of the second package 36 and within the gas cell 31 through the window portion 382.

In addition, a pair of protrusion pieces 381 are provided near lower ends of wall portions facing each other in a light emission direction at a lower end of the magnetic shield 38. Thus, it is possible to easily ascertain the pair of protrusion pieces 381 as guides at the time of mounting the second unit 3 to the supporting plate 7.

A material having a magnetic shielding property is used as the constituent material of the magnetic shield 38. Examples of the constituent material include soft magnetic materials such as Fe and various iron-based alloys (silicon iron, permalloy, amorphous, sendust, and Kovar). Among these, an Fe—Ni based alloy such as Kovar or permalloy is preferably used from the viewpoint of an excellent magnetic shielding property.

In addition, for example, a plurality of leads (not shown) protrude from the magnetic shield 38. The leads are electrically connected to the light detection unit 32, the heater 33, the temperature sensor 34, and the coil 35 through wirings. In addition, the leads are electrically connected to the wiring board 5 using a connector not shown in the drawing, or the like. For example, a flexible substrate or a connector having a socket shape can be used as the connector.

Optical Component

The plurality of optical components 41, 42, and 43 are disposed between the first unit 2 and the second unit 3 which are mentioned above. The plurality of optical components 41, 42, and 43 are provided on the optical axis (axis a) between the light emission unit 21 within the first package 22 mentioned above and the gas cell 31 within the second package 36 mentioned above.

In this embodiment, the optical component 41, the optical component 42, and the optical component 43 are disposed in this order from the first unit 2 side to the second unit 3 side.

The optical component 41 is a λ/4 wavelength plate. Thus, for example, when the excitation light from the light emission unit 21 is linearly polarized light, the excitation light can be converted to circularly polarized light (right circularly polarized light or left circularly polarized light).

As described above, if alkali metal atoms within the gas cell 31 are irradiated with the excitation light which is linearly polarized light in a state where Zeeman splitting of the alkali metal atoms occurs due to a magnetic field of the coil 35 mentioned above, a plurality of levels of the alkali metal atoms having been subjected to Zeeman splitting are uniformly dispersed by interaction between the excitation light and the alkali metal atoms. As a result, the number of alkali metal atoms having a desired energy level becomes relatively smaller than the number of alkali metal atoms having other energy levels. Thus, the number of atoms expressing a desired EIT phenomenon is reduced, and a desired EIT signal becomes small. As a result, the oscillation characteristics of the atomic oscillator 1 are degraded.

On the other hand, as described above, when the alkali metal atoms within the gas cell 31 are irradiated with the excitation light which is circularly polarized light in a state where Zeeman splitting of the alkali metal atoms occurs due to a magnetic field of the coil 35 mentioned above, it is possible to make the number of alkali metal atoms having a desired energy level relatively larger than the number of alkali metal atoms having other energy levels among a plurality of levels of the alkali metal atoms having been subjected to Zeeman splitting, by interaction between the excitation light and the alkali metal atoms. For this reason, the number of atoms expressing a desired EIT phenomenon is increased, and a desired EIT signal becomes large. As a result, it is possible to improve the oscillation characteristics of the atomic oscillator 1.

Meanwhile, the plan-view shape of the optical component 41 is not limited thereto, and may be a polygonal shape such as a quadrilateral shape or a pentagonal shape.

The optical components 42 and 43 are disposed on the second unit 3 side with respect to the optical component 41.

Each of the optical components 42 and 43 is a neutral density filter (ND filter). Thus, it is possible to adjust (decrease) the intensity of the excitation light LL incident on the gas cell 31. For this reason, even when an output of the light emission unit 21 is large, it is possible to set the amount of excitation light incident on the gas cell 31 to a desired amount. In this embodiment, the intensity of the excitation light, which is converted to the circularly polarized light by the optical component 41 mentioned above, is adjusted by the optical components 42 and 43.

In this embodiment, each of the optical components 42 and 43 has a plate shape.

Meanwhile, the plan-view shape of each of the optical components 42 and 43 is not limited thereto, and may be a polygonal shape such as a quadrilateral shape or a pentagonal shape.

In addition, the optical component 42 and the optical component 43 may have the same dimming rate or may have different dimming rates.

In addition, each of the optical components 42 and 43 may have portions having continuously or gradually different dimming rates on the upper side and the lower side thereof. In this case, it is possible to adjust a dimming rate of excitation light by adjusting the positions of the optical components 42 and 43 in a vertical direction with respect to the wiring board 5.

In addition, each of the optical components 42 and 43 may have portions having continuously or gradually different dimming rates in a circumferential direction. In this case, it is possible to adjust a dimming rate of excitation light by rotating the optical components 42 and 43. Meanwhile, in this case, the rotation center of each of the optical components 42 and 43 may be shifted with respect to the axis a.

Meanwhile, any one of the optical components 42 and 43 may be omitted. In addition, when an output of the light emission unit 21 is moderate, both the optical components 42 and 43 can be omitted.

In addition, the optical components 41, 42, and 43 are not limited to the above-described types, arrangement order, number, and the like. For example, each of the optical components 41, 42, and 43 is not limited to the $\lambda/4$ wavelength plate or the neutral density filter, and may be a lens, a polarizing plate, or the like.

Wiring Board

The wiring board 5 has a wiring not shown in the drawing, and has a function of electrically connecting the electronic components such as the control unit 6 mounted to the wiring board 5 and, for example, the connector through the wiring.

In addition, the wiring board 5 has a function of holding each unit of the atomic oscillator 1 mentioned above. Meanwhile, examples of a method of holding the optical components 41, 42, and 43 include a method of providing three concave potions in the wiring board 5 and inserting the optical components 41, 42, and 43 into the respective concave portions, and the like.

Various types of printed wiring boards can be used as the wiring board 5. However, as described above, from the viewpoint of securing rigidity required to maintain a positional relationship between the first unit 2, the second unit 3, and the optical components 41, 42, and 43 which are held in the above-described manner, a substrate having a rigid portion, for example, a rigid substrate and a rigid flexible substrate are preferably used.

Meanwhile, even when a wiring board (for example, flexible substrate) which does not have a rigid portion is used as the wiring board 5, for example, a reinforcing member for improving rigidity is bonded to such a wiring board. Thus, it is possible to maintain a positional relationship between the first package 22, the second package 36, and the optical components 41, 42, and 43.

The control unit 6 is installed on one surface of the wiring board 5. Meanwhile, electronic components other than the control unit 6 may be mounted on the wiring board 5.

Control Unit

The control unit 6 shown in FIG. 1 has a function of controlling the heater 33, the coil 35, and the light emission unit 21.

In this embodiment, the control unit 6 is constituted by an integrated circuit (IC) chip mounted on the wiring board 5.

The control unit 6 includes an excitation light control unit 61 that controls frequencies of the resonance light beams 1 and 2 of the light emission unit 21, a temperature control unit 62 that controls the temperature of an alkali metal in the gas cell 31, and a magnetic field control unit 63 that controls a magnetic field to be applied to the gas cell 31.

The excitation light control unit 61 controls frequencies of the resonance light beams 1 and 2 emitted from the light emission unit 21 on the basis of detection results of the light detection unit 32 mentioned above. More specifically, the excitation light control unit 61 controls the frequencies of the resonance light beams 1 and 2 emitted from the light emission unit 21 so that a frequency difference ($\omega 1 - \omega 2$) is set to a frequency $\omega 0$ inherent in the alkali metal, on the basis of the detection results of the light detection unit 32 mentioned above.

Although not shown in the drawing, the excitation light control unit 61 includes a voltage-controlled quartz crystal oscillator (oscillation circuit) and outputs an oscillation frequency of the voltage-controlled quartz crystal oscillator as an output signal of the atomic oscillator 1 while synchronizing and adjusting the oscillation frequency on the basis of the detection results of the light detection unit 32.

In addition, the temperature control unit 62 controls electrical conduction to the heater 33 on the basis of detection results of the temperature sensor 34. Thus, it is possible to maintain the gas cell 31 within a desired temperature range.

In addition, the magnetic field control unit 63 controls electrical conduction to the coil 35 so that a magnetic field generated by the coil 35 becomes constant.

Supporting Plate

As shown in FIGS. 4 and 6, the supporting plate 7 includes a first supporting portion 71 that supports the first unit 2, a second supporting portion 72 that supports the second unit 3, and a pair of connecting portions 73 that connect the first supporting portion 71 and the second supporting portion 72. The supporting plate 7 is a member supporting the first unit 2 and the second unit 3 on the same face side (top face side) and mounted (connected) on the wiring board 5 on the bottom side thereof.

The first supporting portion 71 has a rectangular shape in a plan view of the supporting plate 7. A concave portion 713 is formed in the first supporting portion 71 by notching a portion on the second supporting portion 72 side. In addition, the first supporting portion 71 supports the first unit 2 on a top face 711. A bottom 712 of the first supporting portion 71 is a portion abutting on the wiring board 5 at the time of mounting the supporting plate 7 to the wiring board 5.

The second supporting portion 72 has a rectangular shape in a plan view of the supporting plate 7. A concave portion 723 is formed in the second supporting portion 72 by notching a portion on the first supporting portion 71 side. In addition, the second supporting portion 72 supports the second unit 3 on a top face 721. A bottom 722 of the second supporting portion 72 is separated from the wiring board 5 in a state where the supporting plate 7 is mounted on the wiring board 5.

In addition, a pair of ribs 724 protruding toward a thickness direction of the supporting plate 7 are formed in the top face 721 of the second supporting portion 72. The pair of ribs 724 extend along an emission direction of the excitation light LL and are disposed on the same straight line in the emission direction of the excitation light LL.

The connecting portions 73 connect the supporting portions 71 and 72 at a location where the second supporting portion 72 is shifted to the top face 711 side of the first supporting portion 71 with respect to the first supporting portion 71 and so that the first supporting portion 71 and the second supporting portion 72 are parallel to each other. The connecting portions 73 are provided on the end faces of the supporting portions 71 and 72 and are separated from each other. In addition, each of the connecting portions 73 has a block shape and is thicker than a plate thickness of each of the supporting portions 71 and 72. Thus, it is possible to increase the rigidity of each of the connecting portions 73 and to effectively reduce deformation by using the connecting portions 73 as supporting points.

In addition, the connecting portion 73 protrudes further upwards than the top face 711 of the first supporting portion 71 and the top face 721 of the second supporting portion 72. Thus, as will be described later, the first unit 2 and the second unit 3 can abut on the connecting portions 73 at the time of positioning the first unit 2 and the second unit 3.

In such an atomic oscillator 1, the first unit 2 and the second unit 3 are supported by the supporting plate 7 at a location where the units are shifted in the thickness direction of the supporting plate 7, but are configured such that the excitation light LL emitted from the light emission unit 21 is incident on the light detection unit 32 through the gas cell 31.

In the supporting plate 7, the connecting portions 73 are provided so as to be separated from each other in a direction perpendicular to the optical axis a, the concave portion 713 is formed in the first supporting portion 71, and the concave portion 723 is formed in the second supporting portion 72. For this reason, a through hole 74 is formed in the supporting plate 7 so as to pass through the supporting plate in the thickness direction between the first supporting portion 71 and the second supporting portion 72 when seen in a plan view. Thus, it is possible to dispose the optical components 41, 42, and 43 in the through hole 74. Examples of a method of disposing the optical components include a method of providing hole portions corresponding to the optical components 41, 42, and 43 in the wiring board 5 and disposing the optical components 41, 42, and 43 in the respective hole portions, and the like. In this case, the supporting plate 7 is disposed on the wiring board 5 so that the through hole 74 of the supporting plate 7 overlaps the hole portions for the respective optical components 41, 42, and 43.

Meanwhile, as described above, the temperature of the alkali metal within the gas cell 31 of the second unit 3 is managed by the heater 33 and the temperature sensor 34, and the alkali metal is maintained in a gaseous state having a desired concentration. As in the related art, when the second unit 3 is provided on the wiring board 5, the temperature of the wiring board 5 rises (changes) due to, for example, a change in an environmental temperature or exhaust heat from the light emission unit 21, and thus there is a concern that heat is transmitted to the second unit 3 from the wiring board 5. Accordingly, there is a concern that oscillation characteristics of the atomic oscillator may be degraded due to a change in the concentration of the gaseous alkali metal.

However, the second unit 3 is set to be in a state where the second unit is separated from the wiring board 5 by the supporting plate 7. That is, a gap is provided between the second unit 3 and the wiring board 5. Thus, it is possible to prevent direct heat transmission from the wiring board 5 to the second unit 3. Accordingly, the atomic oscillator 1 has excellent reliability.

In addition, as described above, the pair of connecting portions 73 are provided so as to be separated from each other. Thus, it is possible to reduce a cross-sectional area of the connecting portion 73, for example, as compared with a case where the connecting portions 73 are constituted by a pair of plate pieces. Accordingly, as the cross-sectional area becomes smaller, the amount of heat transmission from the first supporting portion 71 to the second supporting portion 72 can be further reduced. Therefore, the atomic oscillator 1 has more excellent reliability.

In addition, when the first unit 2 and the second unit 3 are directly provided on the wiring board 5 or the supporting plate 7 has a flat plate shape, a positional relationship between the first unit 2 and the second unit 3 is changed at the time of the deformation of the wiring board 5, and thus there is the possibility of the excitation light LL emitted from the light emission unit 21 not being efficiently incident on the light detection unit 32. In the atomic oscillator 1, the supporting plate 7 may be supported by the wiring board 5 at both ends thereof. However, it is preferable that the supporting plate is supported on one of both end sides and that the second unit 3 is disposed on the other end side, that is, a free end side (second supporting portion 72). For this reason, even when the first unit 2 is displaced due to the deformation of the wiring board 5, the first unit 2 is displaced together with the second unit 3. That is, a positional relationship between the first unit 2 and the second unit 3 is fixed by the supporting plate 7. Thus, the positional relationship between the first unit 2 and the second unit 3 is not changed, and the excitation light LL emitted from the light emission unit 21 is reliably incident on the light detection unit 32. Accordingly, it is possible to maintain high oscillation characteristics of the atomic oscillator 1 and to obtain the atomic oscillator 1 having excellent reliability.

Hereinafter, a method of positioning the first unit 2 and the second unit 3 with respect to the supporting plate 7 will be described.

When the first unit 2 is disposed in the first supporting portion 71 of the supporting plate 7, first, the leg portions 222 of the first package 22 are made to abut on the top face 711 of the first supporting portion 71. In this abutting state, two leg portions 222 on the connecting portions 73 side among the leg portions 222 are pressed against the connecting portions 73 to the right side in FIG. 6 along the emission direction of the excitation light LL. Thus, it is possible to position the first unit 2 in the emission direction of the excitation light LL.

Meanwhile, as a method of positioning the first unit 2 in the width direction (direction perpendicular to the optical axis a) of the supporting plate 7, for example, a separation distance between the leg portions 222 facing each other in the width direction of the supporting plate 7 is formed to be the same size as the width of the concave portion 713 of the first supporting portion 71. It is possible to position the first unit 2 while shifting the first unit 2 with respect to the supporting plate 7 so that the separation distance between the leg portions 222 coincides with the width of the concave portion 713 by using the separation distance and the width as guides.

On the other hand, when the second unit 3 is disposed in the second supporting portion 72 of the supporting plate 7, first, the bottom of the magnetic shield 38 is made to abut on the top face 721 of the second supporting portion 72. In this abutting state, the lateral side of the magnetic shield 38 on the connecting portions 73 side is pressed against the connecting portions 73 to the left side in FIG. 6 along the emission direction of the excitation light LL. Thus, it is possible to position the second unit 3 in the emission direction of the excitation light LL.

In addition, the positioning of the second unit 3 in the width direction of the supporting plate 7 can be performed by pressing the lateral side of the magnetic shield 38 on the ribs 724 side against the pair of ribs 724 provided on the top face 721 of the second supporting portion 72. Similarly, the positioning of the first unit 2 in the width direction of the supporting plate 7 may be performed by providing a rib or the like on the top face 711 of the first supporting portion 71 and performing pressing against the rib.

In this manner, the connecting portions 73 also function as positioning portions that perform the positioning of the first unit 2 and the second unit 3 in the emission direction of the excitation light LL.

As described above, according to the supporting plate 7, it is possible to position the first unit 2 and the second unit 3 on the supporting plate 7 and to dispose the supporting plate on the wiring board 5 in a state where the optical axes thereof coincide with each other. When the supporting plate 7 is omitted, it is necessary to position the first unit 2 and the second unit 3 on the wiring board 5. In this case, it is necessary to provide the rib mentioned above in the wiring board 5 or to form an alignment mark in the wiring board 5 with a high level of accuracy. As compared with such a method, it is possible to obtain the atomic oscillator 1 in which positioning is performed with a high level of accuracy by using an extremely simple method of easily performing the positioning of the first unit 2 and the second unit 3 on the supporting plate 7 as described above and then disposing the supporting plate 7 on the wiring board 5 in the atomic oscillator 1.

A material constituting the supporting plate 7 is not particularly limited. For example, various types of ceramic materials, various types of metal materials, and various types of resin materials can be used as the material. Among these, a metal material is preferably used as a constituent material of the supporting plate 7. In particular, from the viewpoint of radiating exhaust heat of the first unit 2 to the outside of the first unit 2, the first supporting portion 71 effectively performs the heat radiation by using a metal material having a relatively high thermal conductivity as the constituent material of the supporting plate. Examples of the metal material include aluminum, an aluminum alloy, iron, and the like. Meanwhile, when at least the first supporting portion 71 in the supporting plate 7 is formed of a metal material, the above-described effect can be exhibited.

In the supporting plate 7, the first supporting portion 71, the second supporting portion 72, and the connecting portion 73 may be integrally formed, or may be formed as separate bodies and may be connected to each other. The first supporting portion 71, the second supporting portion 72, and the connecting portion 73 may be formed of the same material or may be different materials.

As described above, according to the supporting plate 7, it is possible to reduce optical axis deviations of the first unit 2 and the second unit 3 which are caused by the distortion of the wiring board 5, or the like, and to reduce influence on the gas cell 31 due to heat from the outside.

Second Embodiment

Next, a second embodiment of the invention will be described.

Figure 7A:
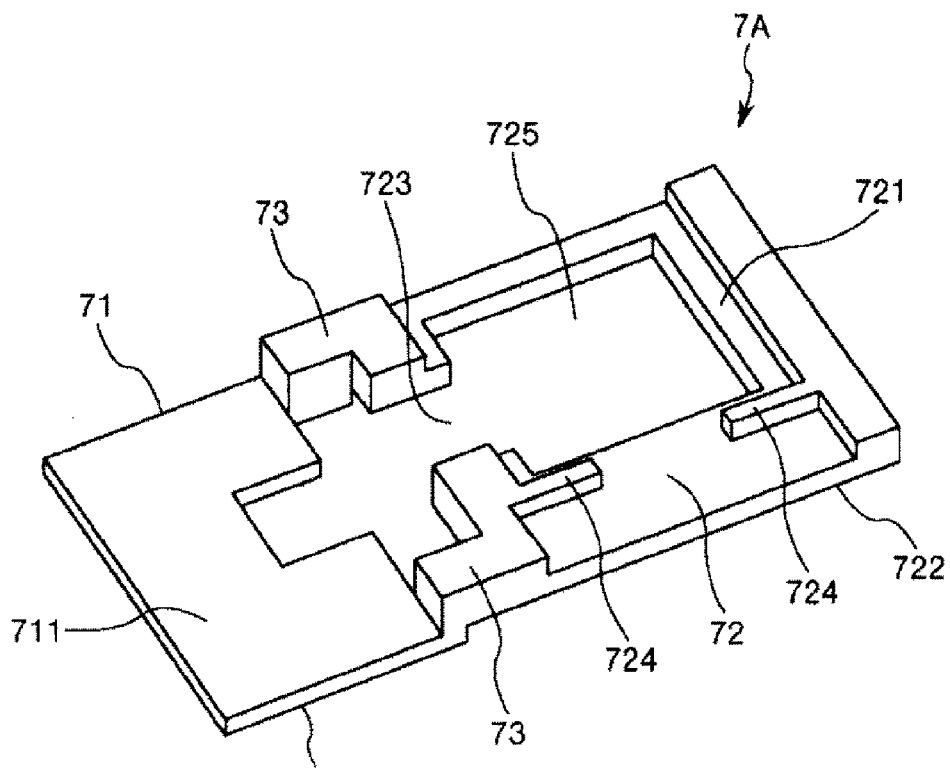
FIGS. 7A and 7B are diagrams showing a connection member included in an atomic oscillator (quantum interference device) according to a second embodiment of the invention.
Figure 7B:
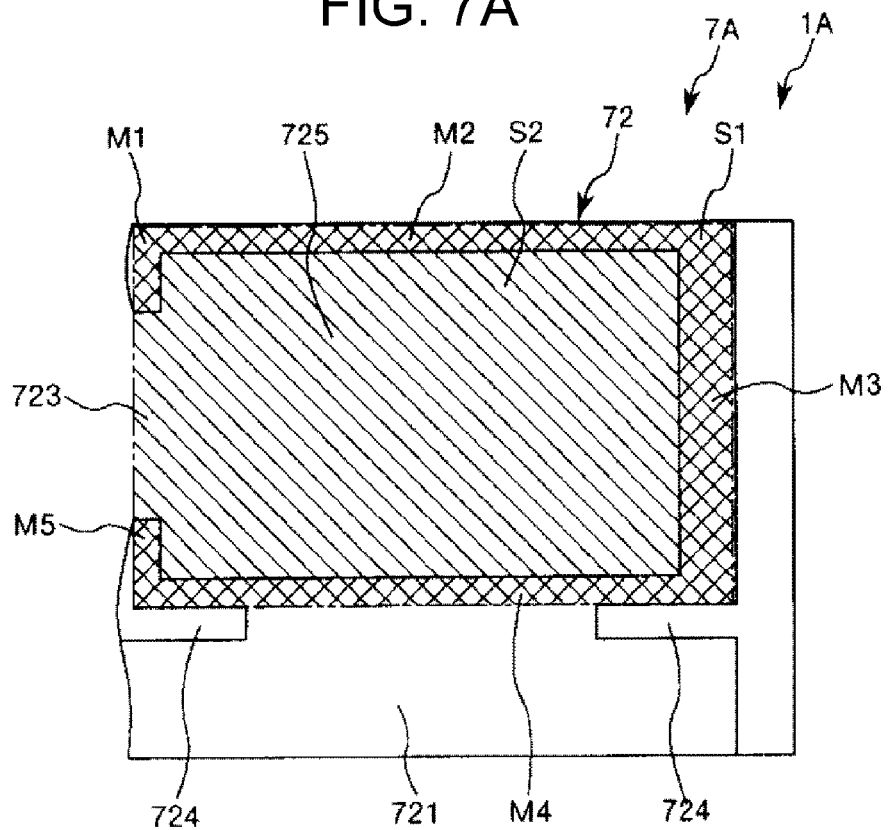

FIGS. 7A and 7B are diagrams showing a connection member included in an atomic oscillator (quantum interference device) according to the second embodiment of the invention. FIG. 7A is a perspective view, and FIG. 7B is a plan view.

This embodiment is the same as the first embodiment mentioned above except that the configuration of a supporting plate is different.

Meanwhile, in the following description, the second embodiment will be described focusing on the differences from the first embodiment, and the description of similar matters will be omitted. In FIGS. 7A and 7B, the same components as those in the above-described embodiment will be denoted by the same reference numerals and signs. In FIG. 7B, a protrusion piece 381 is not shown in order to facilitate understanding (the same is true of FIGS. 8A and 8B).

As shown in FIGS. 7A and 7B, in an atomic oscillator 1A, a through hole 725 is formed in a second supporting portion 72 of a supporting plate 7A so as to pass through the second supporting portion in the thickness direction thereof. The through hole 725 has a rectangular shape in a plan view of the supporting plate 7A and communicates with the through hole 74. In addition, an area of an opening of the through hole 725 in a plan view of the supporting plate 7 is smaller than an area of a second unit 3 (magnetic shield 38) in a plan view of the supporting plate 7, and thus the second unit 3 can be disposed in the second supporting portion 72 so as to cover the through hole 725. In this arrangement state, the second unit 3 is configured so as to face a gap between the supporting plate 7A and a wiring board 5. Thus, it is possible to reduce a contact area between the second unit 3 and the supporting plate 7A in the arrangement state.

In the arrangement state, an area S1 of a region (portion shown by reticular hatching in FIG. 7B) where the supporting plate 7 and the second unit 3 overlap each other, that is, come into contact with each other in a plan view of the supporting plate 7 is preferably equal to or less than 50% of an area S2 of the second unit 3 (portion shown by right-downward hatching in FIG. 7B) in a plan view of the supporting plate 7 and is more preferably equal to or less than 30%. Thus, it is possible to make the contact area between the second supporting portion 72 and the second unit 3 sufficiently small. As a result, it is possible to sufficiently reduce heat transmission from the second supporting portion 72 to the second unit 3.

Further, the portion where the supporting plate 7 and the second unit 3 come into contact with each other can be divided into five faces M1, M2, M3, M4, and M5 which are continuous with each other. In addition, the arrangement positions and the arrangement directions of the faces M1 to M5 are different from each other. For this reason, when the contact area (sum of the faces M1 to M5) is equal, heat transmitted from the supporting plate 7 to the second unit 3 is distributed, as compared with a case where the faces are collected at one location so as to form, for example, a rectangle. Accordingly, it is possible to effectively reduce heat transmission from the second supporting portion 72 to the second unit 3.

Meanwhile, the second supporting portion 72 may have a shape in which the faces M1 to M5 are independent of each other, that is, a shape in which the faces do not come into contact with each other.

In addition, substantially the same effect can be exhibited even when the through hole 725 does not pass through the second supporting portion 72 in the thickness direction thereof and is a bottomed concave portion which is opened to a top face 721 of the second supporting portion 72.

Third Embodiment

Next, a third embodiment of the invention will be described.

Figure 8A:
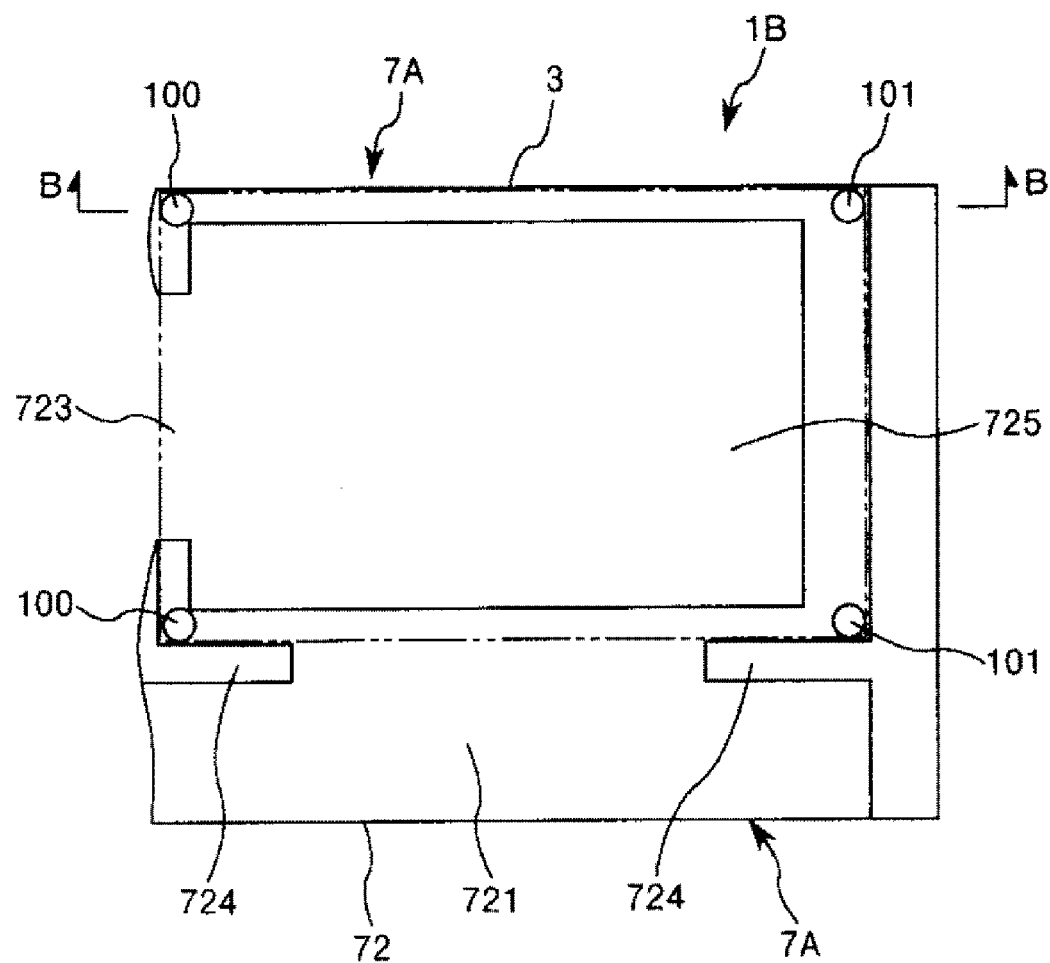
FIGS. 8A and 8B are diagrams showing a connection member included in an atomic oscillator (quantum interference device) according to a third embodiment of the invention.
Figure 8B:
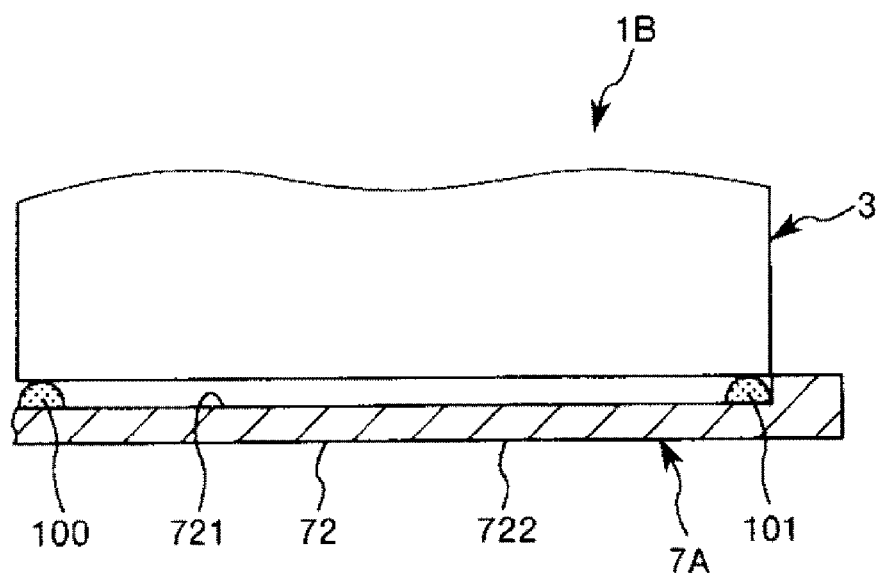

FIGS. 8A and 8B are diagrams showing a connection member included in an atomic oscillator (quantum interference device) according to the third embodiment of the invention. FIG. 8A is a plan view, and FIG. 8B is a cross-sectional view taken along line B-B in FIG. 8A.

The atomic oscillator according to this embodiment is the same as the atomic oscillator according to the second embodiment mentioned above except that heat insulators are provided.

Meanwhile, in the following description, the atomic oscillator according to the third embodiment will be described focusing on the differences from the second embodiment, and the description of similar matters will be omitted. In FIGS. 8A and 8B, the same components as those in the above-described embodiment will be denoted by the same reference numerals and signs.

As shown in FIGS. 8A and 8B, in an atomic oscillator 1B, heat insulators 101 are provided between a supporting plate 7A and a second unit 3. Thus, it is possible to hold the supporting plate 7A and the second unit 3 which are separated from each other. Accordingly, it is possible to more effectively reduce heat transmission from the supporting plate 7A to the second unit 3. Further, each of the heat insulators 101 is formed of a material having a relatively low thermal conductivity. For this reason, it is possible to effectively reduce heat transmission from the supporting plate 7A to the second unit 3 through the heat insulators 101.

Further, the heat insulators are provided at four locations corresponding to four corners of the second unit 3 in a plan view of the supporting plate 7. Thus, the second unit 3 disposed on the supporting plate 7 (heat insulators 101) is stably supported. In addition, since a contact area between the supporting plate 7 and the second unit 3 is extremely small, it is possible to further effectively reduce heat transmission from the supporting plate 7A to the second unit 3.

A material constituting the heat insulator 101 is not particularly limited, and materials having a relatively low thermal conductivity such as various types of resin materials and various types of ceramic materials can be used as the material.

In this manner, the heat insulators 101 reduce heat transmission between the supporting plate 7A and the second unit 3, and function as spacers that separate the supporting plate 7A and the second unit 3 from each other and hold the supporting plate and the second unit. In addition, the heat insulator 101 may have a function as an adhesive.

Fourth Embodiment

Next, a fourth embodiment of the invention will be described.

Figure 9:
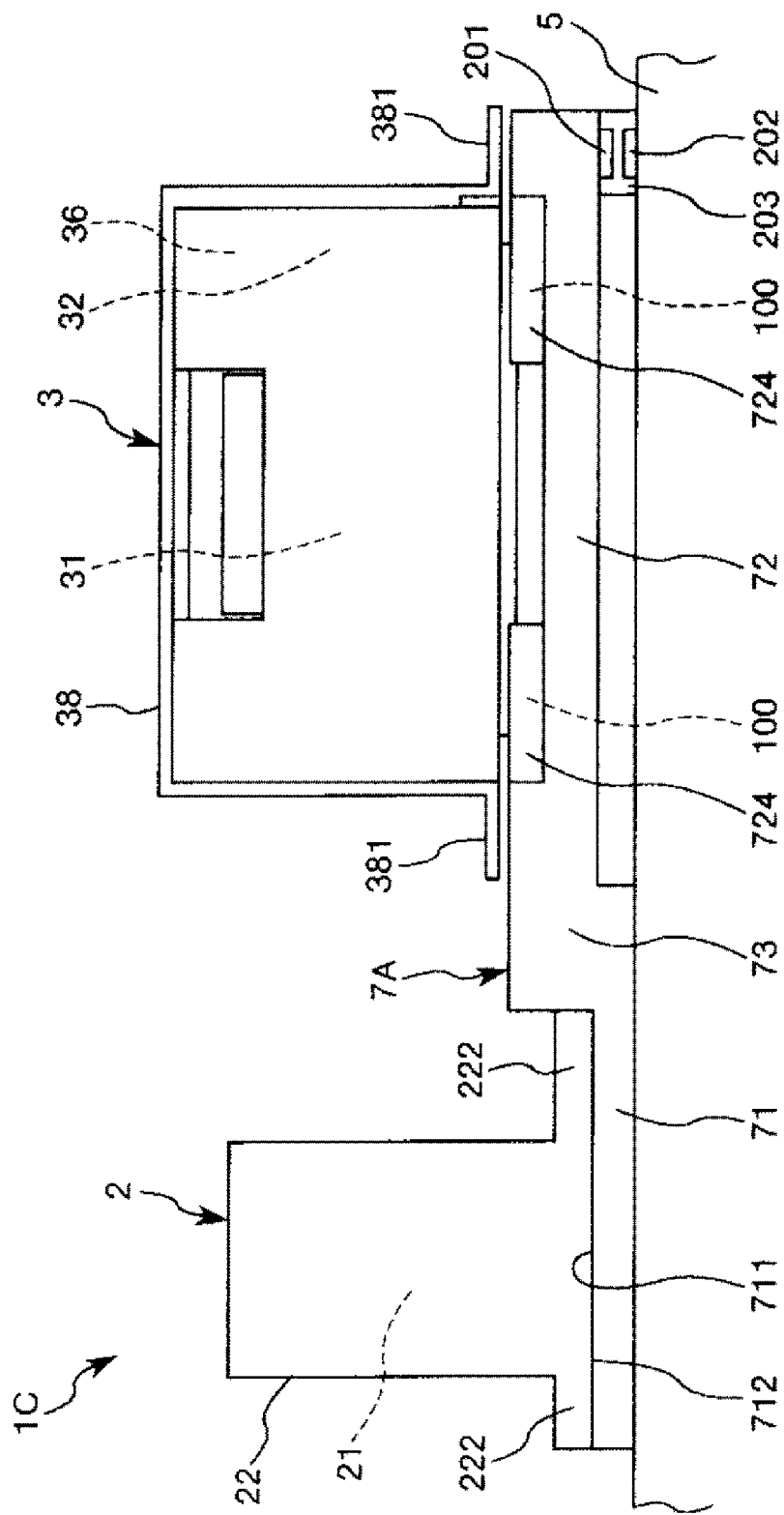
FIG. 9 is a side view of an atomic oscillator (quantum interference device) according to a fourth embodiment of the invention.

FIG. 9 is a side view of an atomic oscillator (quantum interference device) according to the fourth embodiment of the invention.

The atomic oscillator according to this embodiment is the same as the atomic oscillator according to the first embodiment mentioned above except that a heat insulator is provided.

Meanwhile, in the following description, the atomic oscillator according to the fourth embodiment will be described focusing on the differences from the third embodiment, and the description of similar matters will be omitted. In FIG. 9, the same components as those in the above-described embodiment will be denoted by the same reference numerals and signs.

As shown in FIG. 9, in an atomic oscillator 1C, a spacer 203 as a regulation member that regulates a separation distance between a second supporting portion 72 of a supporting plate 7 and a wiring board 5 is provided therebetween. Thus, it is possible to further effectively reduce the deformation of the supporting plate 7 by using a connecting portion 73 as a supporting point.

The spacer 203 has a block shape, and is provided with a concave portion 201 opened to the top (surface on the supporting plate 7 side) and a concave portion 202 opened to the bottom (surface on the wiring board 5 side). Thus, when the spacer 203 is disposed between the supporting plate 7 and the wiring board 5, it is possible to reduce a contact area therebetween. As a result, it is possible to reduce heat transmission between the supporting plate 7 and the wiring board 5 through the spacer 203.

Meanwhile, a material constituting the spacer 203 is not particularly limited. However, similarly to the heat insulator 101 mentioned above, it is preferable that the spacer is constituted by a material having a low thermal conductivity. Thus, the spacer 203 can more prominently exhibit the above-described effect.

In addition, a plurality of spacers may be provided, or one rod-shaped spacer may be provided.

Fifth Embodiment

Next, a fifth embodiment of the invention will be described.

Figure 10:
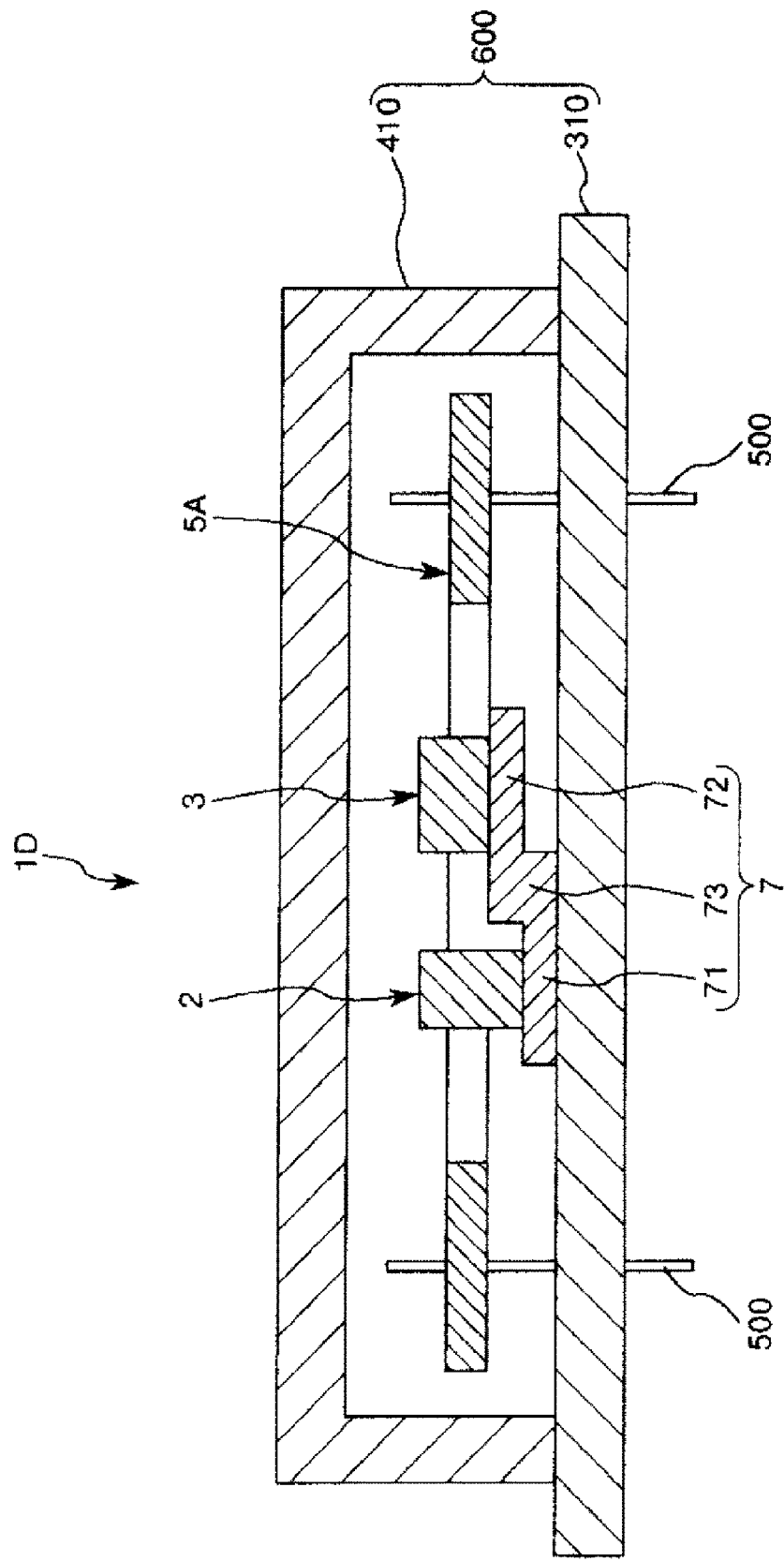
FIG. 10 is a cross-sectional view of an atomic oscillator (quantum interference device) according to a fifth embodiment of the invention.
Figure 11:
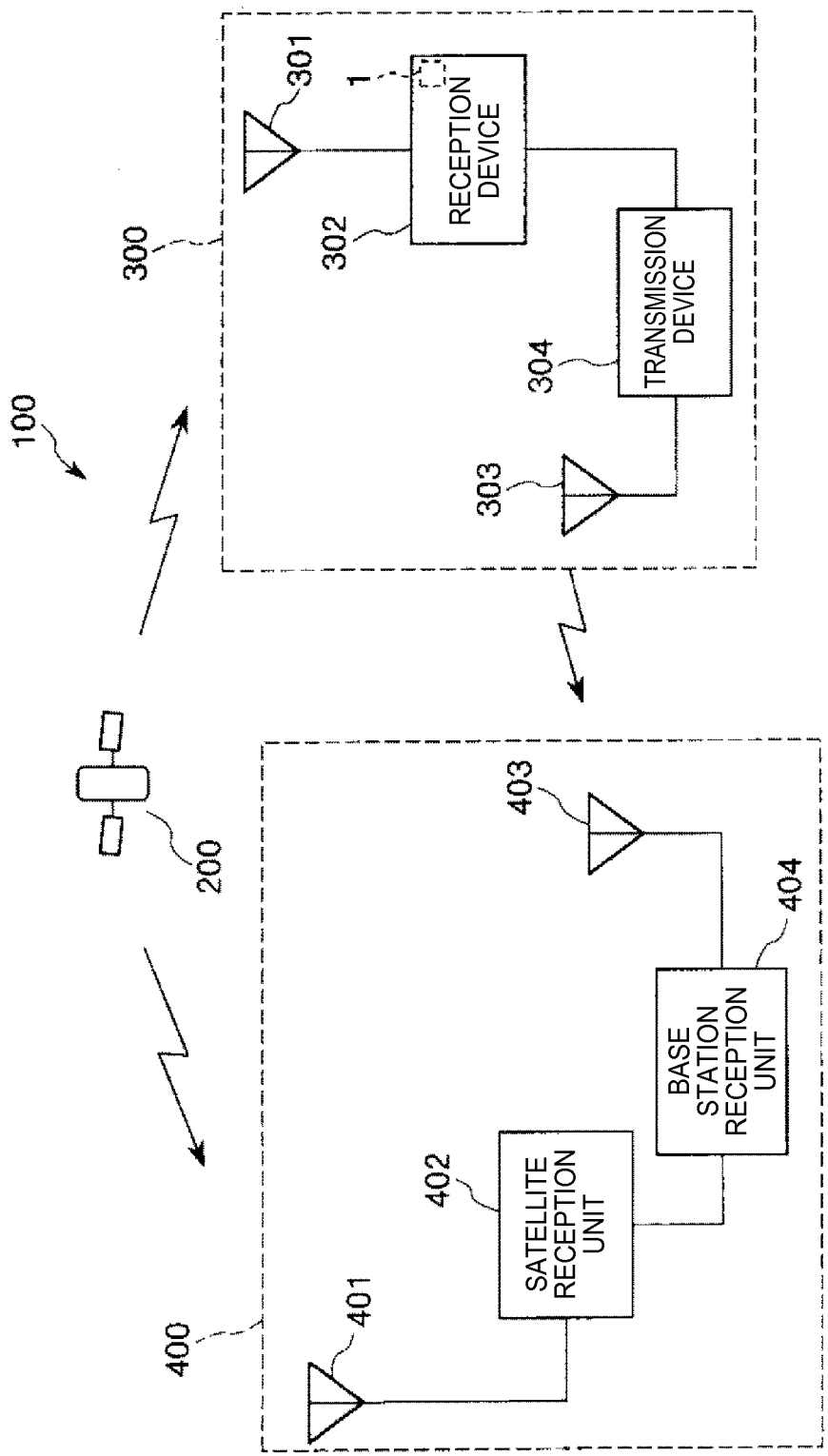
FIG. 11 is a diagram showing a schematic configuration in a case where the atomic oscillator (quantum interference device) according to the invention is used in a positioning system using a GPS satellite.

FIG. 10 is a cross-sectional view of an atomic oscillator (quantum interference device) according to a fifth embodiment of the invention.

The atomic oscillator according to this embodiment is substantially the same as the atomic oscillator according to the first embodiment mentioned above except that an external package is provided.

Meanwhile, in the following description, the atomic oscillator according to the fifth embodiment will be described focusing on the differences from the first embodiment, and the description of similar matters will be omitted. In FIG. 10, the same components as those in the above-described embodiment will be denoted by the same reference numerals and signs.

As shown in FIG. 10, an atomic oscillator 1D includes an external package 600 accommodating a wiring board 5A and a supporting plate 7. The external package 600 includes a base plate 310 that supports the wiring board 5A and the supporting plate 7, and a cover member 410 which is provided so as to cover the wiring board 5A and the supporting plate 7 with respect to the base plate 310. In addition, the base plate 310 and the cover member 410 are fixed to each other using an adhesive not shown in the drawing, or the like.

In addition, the wiring board 5A has a frame shape, and is provided so as to surround the supporting plate 7 on which a first unit 2 and a second unit 3 are disposed. In addition, a control unit, a wiring, and the like are disposed on the wiring board 5A. The wiring board 5A is held so as to be separated from the base plate 310 using a plurality of conductive pins 500.

The conductive pins 500 pass through the base plate 310 and are exposed to the outside of the external package 600, and the wiring board 5A is electrically connected to the outside through the exposed portions.

The same effects as those in the above-described embodiments can be exhibited also in the atomic oscillator 1D. Meanwhile, in this embodiment, the first unit and the second unit are separated from the wiring board 5A, and thus it is possible to reduce the influence of heat from the wiring board 5A on the first unit 2 and the second unit 3. In addition, since the base plate 310 and a second supporting portion 72 of the supporting plate 7 are separated from each other, it is possible to reduce heat transmission from the base plate 310 to the second supporting portion 72 and the second unit 3.

The quantum interference device and the atomic oscillator which are mentioned above can be incorporated in various types of electronic apparatuses. The electronic apparatuses have excellent reliability.

Hereinafter, an electronic apparatus according to the invention including the quantum interference device and the atomic oscillator according to the invention will be described.

2. Electronic Apparatus

Hereinafter, an electronic apparatus according to the invention will be described.

Figure 12:
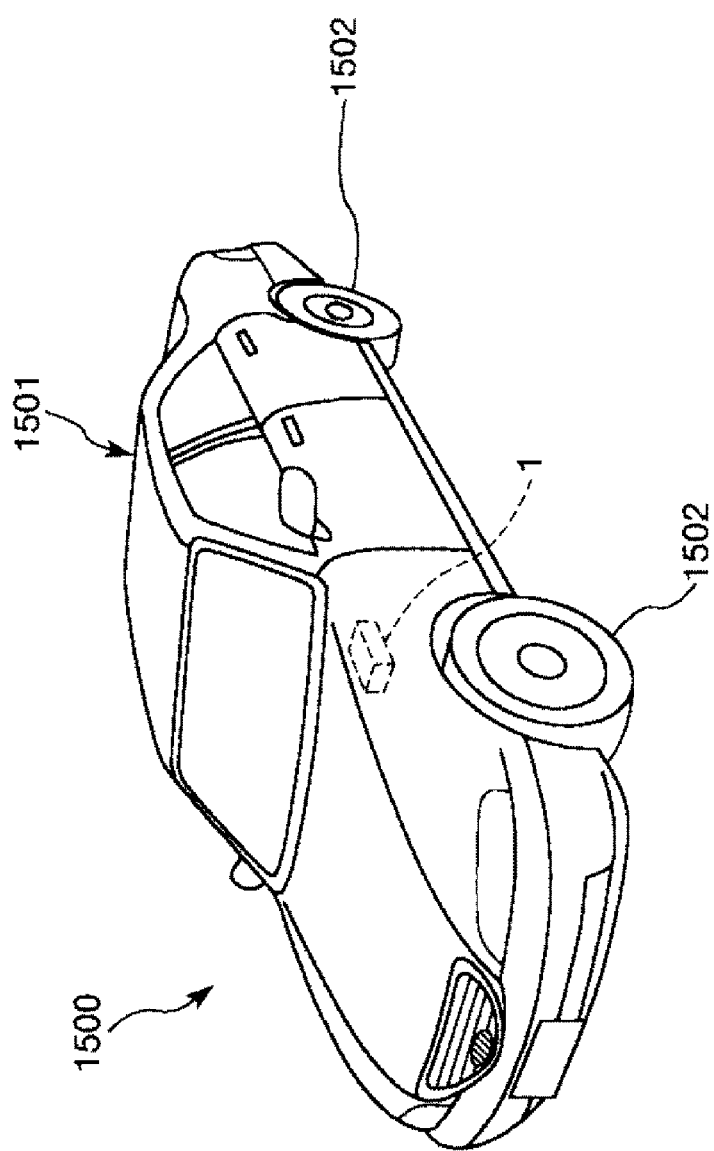
FIG. 12 is a diagram showing an example of a moving object according to the invention.

FIG. 12 is a diagram showing a schematic configuration in a case where the atomic oscillator (quantum interference device) according to the invention is used in a positioning system using a GPS satellite.

A positioning system 100 shown in FIG. 12 includes a GPS satellite 200, a base station device 300, and a GPS reception device 400.

The GPS satellite 200 transmits positioning information (GPS signal).

The base station device 300 includes a reception device 302 that receives positioning information from the GPS satellite 200 with a high level of accuracy through an antenna 301 installed, for example, at an electronic reference point (GPS continuous observation station), and a transmission device 304 that transmits the positioning information, which is received by the reception device 302, through an antenna 303.

Here, the reception device 302 is an electronic device including the atomic oscillator 1 mentioned above according to the invention as the reference frequency oscillation source thereof. The reception device 302 has excellent reliability. In addition, the positioning information received by the reception device 302 is transmitted by the transmission device 304 in real time.

The GPS reception device 400 includes a satellite reception unit 402 that receives positioning information from the GPS satellite 200 through an antenna 401, and a base station reception unit 404 that receives positioning information from the base station device 300 through an antenna 403.

3. Moving Object

FIG. 12 is a diagram showing an example of a moving object according to the invention.

In this diagram, a moving object 1500 includes a car body 1501 and four wheels 1502, and is configured to rotate the wheels 1502 using a power source (engine), not shown in the drawing, which is provided in the car body 1501. The atomic oscillator 1 is incorporated in the moving object 1500.

According to such a moving object, it is possible to exhibit excellent reliability.

Meanwhile, an electronic apparatus including the atomic oscillator (quantum interference device) according to the invention is not limited to the above-described apparatus, and can be applied to, for example, a mobile phone, a digital still camera, an ink jet type discharge apparatus (for example, an ink jet printer), a personal computer (a mobile personal computer and a laptop type personal computer), a television, a video camera, a video tape recorder, a car navigation apparatus, a pager, an electronic organizer (an electronic organizer with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish finder, various measurement apparatuses, instruments (for example, instruments for vehicles, aircraft, and ships), a flight simulator, terrestrial digital broadcasting, a mobile phone base station, and the like.

The quantum interference device, the atomic oscillator, the electronic apparatus, and the moving object according to the invention have been described so far with reference to the embodiments shown in the drawings, but the invention is not limited thereto.

In the quantum interference device, the atomic oscillator, the electronic apparatus, and the moving object according to the invention, a configuration of each unit can be replaced with any configuration exhibiting the same function, and can be added with any configuration.

In the quantum interference device, the atomic oscillator, the electronic apparatus, and the moving object according to the invention, any configurations of the above-described embodiment may be combined with each other.

Meanwhile, in the above-described embodiments, the magnetic shield may be omitted. In this case, the second package and the supporting plate come into contact with each other, but the above-described effects can be similarly exhibited in the quantum interference device, the atomic oscillator, the electronic apparatus, and the moving object.

The entire disclosure of Japanese Patent Application No. 2013-259640, filed Dec. 16, 2013 is expressly incorporated by reference herein.

What is claimed is:

1. A quantum interference device comprising:
   a substrate;
   a gas cell unit that includes a gas cell in which metal atoms are sealed;
   a power supply unit that includes a power supply emitting light, which includes a resonance light pair for resonating the metal atoms, toward the metal atoms; and
   a connection member that is connected to the gas cell unit and the power supply unit above one surface side thereof and is connected to the substrate above the other surface side thereof,
   wherein a portion of the connection member which is connected to the gas cell unit has a portion which is separated from the substrate above the other surface side.

2. The quantum interference device according to claim 1, wherein a gap is provided between the gas cell unit and the substrate.

3. The quantum interference device according to claim 1, wherein an area of a region where the connection member and the gas cell unit overlap each other in a plan view of the connection member is equal to or less than 50% of an area of the gas cell unit in a plan view of the connection member.

4. The quantum interference device according to claim 1, wherein the connection member and the gas cell unit come into contact with each other through a plurality of surfaces.

5. The quantum interference device according to claim 1, wherein one end side of the connection member is supported by the substrate, and the other end side thereof is connected to the gas cell unit.

6. The quantum interference device according to claim 1, wherein a regulation member is provided between the substrate and the portion of the connection member which is connected to the gas cell unit so as to regulate a separation distance therebetween.

7. The quantum interference device according to claim 1, wherein a heat insulator is provided between the connection member and the gas cell unit.

8. The quantum interference device according to claim 1, wherein a portion of the connection member which is connected to at least the power supply unit includes a metal material.

9. The quantum interference device according to claim 1, wherein the connection member includes a positioning portion that performs positioning in an emission direction of the light.

10. An atomic oscillator comprising the quantum interference device according to claim 1.

11. An electronic apparatus comprising the quantum interference device according to claim 1.

12. A moving object comprising the quantum interference device according to claim 1.

* * * * *